US012590926B2

(12) United States Patent
Ballandras et al.

(10) Patent No.: US 12,590,926 B2
(45) Date of Patent: Mar. 31, 2026

(54) SURFACE ACOUSTIC WAVE SENSOR DEVICE

(71) Applicant: Soitec, Bernin (FR)

(72) Inventors: Sylvain Ballandras, Besançon (FR); Thierry LaRoche, Besançon (FR); Julien Garcia, Chamblay (FR); Emilie Courjon, Franois (FR)

(73) Assignee: Soitec, Bernin (FR)

( * ) Notice: Subject to any disclaimer, the term of this patent is extended or adjusted under 35 U.S.C. 154(b) by 220 days.

(21) Appl. No.: 18/548,847

(22) PCT Filed: Mar. 3, 2022

(86) PCT No.: PCT/EP2022/055371
§ 371 (c)(1),
(2) Date: Sep. 1, 2023

(87) PCT Pub. No.: WO2022/184815
PCT Pub. Date: Sep. 9, 2022

(65) Prior Publication Data
US 2024/0159710 A1      May 16, 2024

(30) Foreign Application Priority Data
Mar. 3, 2021    (FR) ...................................... 2102072

(51) Int. Cl.
*G01N 29/02* (2006.01)
*H03H 9/145* (2006.01)
*H03H 9/25* (2006.01)

(52) U.S. Cl.
CPC ....... *G01N 29/022* (2013.01); *H03H 9/14502* (2013.01); *H03H 9/25* (2013.01); *G01N 2291/0422* (2013.01)

(58) Field of Classification Search
CPC ......... G01N 29/022; G01N 2291/0422; G01N 2291/0423; G01N 29/2462;
(Continued)

(56) References Cited

U.S. PATENT DOCUMENTS 6,316,861 B1 *  11/2001  Ballandras ......... H03H 9/02551
                                                310/313 D
6,377,138 B1 *   4/2002  Takagi ............... H03H 9/02929
                                                333/195
(Continued)

FOREIGN PATENT DOCUMENTS

CN        104768113 A      7/2015
EP          0998037 A1      5/2000
(Continued)

OTHER PUBLICATIONS

French Search Report and Opinion for Application No. 2102072 dated Nov. 19, 2023, 12 pages.
(Continued)

*Primary Examiner* — Francis C Gray
(74) *Attorney, Agent, or Firm* — TraskBritt

(57) ABSTRACT

An acoustic wave sensor device comprises a first interdigitated transducer, a first reflection structure, a second reflection structure, a first resonance cavity comprising a first upper surface and formed between the first interdigitated transducer and the first reflection structure, and a second resonance cavity comprising a second upper surface and formed between the first interdigitated transducer and the second reflection structure. At least one of the first and
(Continued)

second upper surfaces is covered at least partly by a metalization layer or a passivation layer. The present invention relates also to an acoustic wave sensor assembly.

22 Claims, 6 Drawing Sheets

(58) Field of Classification Search
CPC .. H03H 9/14502; H03H 9/25; H03H 9/02551; H03H 9/02559; H03H 9/02574; H03H 9/6459; H03H 9/6476; G01K 11/265
See application file for complete search history.

(56) References Cited

U.S. PATENT DOCUMENTS

| | | | | |
|---|---|---|---|---|
| 7,504,760 | B2 * | 3/2009 | Fujimoto | H03H 9/14541 |
| | | | | 333/195 |
| 2004/0244466 | A1 | 12/2004 | Shen | |
| 2006/0049714 | A1 * | 3/2006 | Liu | G01S 13/755 |
| | | | | 310/313 R |
| 2015/0000414 | A1 * | 1/2015 | Yoshimura | G01H 11/08 |
| | | | | 73/649 |

| | | | | |
|---|---|---|---|---|
| 2017/0033840 | A1 | 2/2017 | Ballandras et al. | |
| 2020/0257950 | A1 * | 8/2020 | Plesski | G10K 11/28 |
| 2021/0265980 | A1 * | 8/2021 | Ballandras | H03H 9/02669 |
| 2022/0341881 | A1 * | 10/2022 | Ballandras | G01K 11/265 |
| 2023/0223918 | A1 * | 7/2023 | Jewula | H03H 9/14541 |
| | | | | 333/193 |

FOREIGN PATENT DOCUMENTS

| | | | |
|---|---|---|---|
| JP | 64-500052 | A | 1/1989 |
| JP | 2000-151352 | A | 5/2000 |
| JP | 2008-224582 | A | 9/2008 |
| JP | 2013-148572 | A | 8/2013 |
| WO | 2019/175315 | A1 | 9/2019 |
| WO | 2020/021029 | A2 | 1/2020 |

OTHER PUBLICATIONS

International Search Report for Application No. PCT/EP2022/055371 dated Jun. 9, 2022, 6 pages.
International Written Opinion for Application No. PCT/EP2022/055371 dated Jun. 9, 2022, 11 pages.
Japanese Notice of Reasons for Rejections for Application No. 2023-547061 dated Dec. 2, 2025, 4 pages.

\* cited by examiner

SURFACE ACOUSTIC WAVE SENSOR DEVICE

CROSS REFERENCE TO RELATED APPLICATIONS

This application is a national phase entry under 35 U.S.C. § 371 of International Patent Application PCT/EP2022/055371, filed Mar. 3, 2022, designating the United States of America and published as International Patent Publication WO 2022/184815 A1 on Sep. 9, 2022, which claims the benefit under Article 8 of the Patent Cooperation Treaty to French Patent Application Serial No. FR2102072, filed Mar. 3, 2021.

TECHNICAL FIELD

The present disclosure relates to sensors of the acoustic wave type and, in particular, a surface acoustic wave sensor device comprising an interdigitated transducer and resonance cavities.

BACKGROUND

Sensors are of growing importance and become more and more ubiquitous in every-day life. Microelectromechanical systems (MEMS) are an attractive option to answer the demand for increased performances of sensors along with decreased sizes and costs. Surface acoustic wave (SAW) sensors, and to a lower extent bulk acoustic wave (BAW) sensors or Lamb wave or Love wave acoustic sensors, offer particularly advantageous options due to a wide variety of measurable ambient parameters including temperature, pressure, strain and torque, for example.

Acoustic wave sensors utilize the piezoelectric effect to transduce an electrical signal into a mechanical/acoustic wave. SAW-based sensors are built on single-crystal piezoelectric materials like quartz ($SiO_2$), lithium niobate ($LiNbO_3$), lithium tantalate ($LiTaO_3$), langasite (LGS) or poly-crystal piezoelectric materials like aluminum nitride (AlN) or zinc oxide (ZnO), in particular, deposited on silicon, or even on a Piezo-On-Insulator (POI) composite material comprising a layer of piezoelectric material, in particular, a single-crystal material, such as, for example, lithium tantalate or lithium niobate, bonded to a support substrate as, for instance, silicon, if necessary by means of a bonding layer, as, for instance, a silicon oxide layer (in general, any combination of a single crystal piezoelectric material with non-piezoelectric substrates can be used in view of their specific properties like thermo-elastic properties or acoustic quality).

In the case of a surface acoustic wave sensor, an inter-digitated transducer (IDT), converts the electrical energy of the electrical signal into acoustic wave energy. The acoustic wave travels across the surface (or bulk) of a device substrate via the so-called delay line to another transducer, in particular, an IDT, that converts the acoustic wave back to an electrical signal that can be detected. In some devices, mechanical absorbers and/or reflectors are provided in order to prevent interference patterns and to reduce insertion loss. In some devices, the other (output) IDT is replaced by a reflector that reflects the generated acoustic wave back to the (input) IDT that can be coupled to an antenna for remote interrogation of the sensor device. Advantageously, the measurements can be performed completely passively, i.e., the sensor has not to be powered by a power source.

A particular class of acoustic wave sensors comprises resonators exhibiting resonance frequencies that vary according to varying ambient conditions. FIG. 1 illustrates an example of a resonant acoustic wave sensor. The surface acoustic wave resonator comprises an electroacoustic inter-digitated transducer IDT with interdigitated comb electrodes C and C' arranged between Bragg mirrors M. The comb electrodes are set at opposite potentials +V and −V, respectively. The electrode geometry is defined by the pitch p, i.e., the spatial repetition frequency of the interleaved electrodes C and C' in the direction of the propagation of the excited surface acoustic waves, the lengths of the gaps between the electrodes C and C' in the direction perpendicular to the direction of the propagation of the excited surface acoustic waves, the lengths of the acoustic aperture region given by the lengths of the electrodes C and C' between the gaps and the widths a of the electrodes C and C' determining the so-called metalization ratio a/p. The IDT can operate at Bragg conditions at which the wavelength λ, of the excited surface acoustic wave equals twice the pitch p, for example.

At the resonance frequency, the condition of synchronism between the reflectors is satisfied thereby allowing for a coherent addition of the different reflections, which occur under the reflectors. A maximum of acoustic energy is observed within the resonant cavity and, from an electrical point of view, a maximum of amplitude of the current admitted by the transducer is observed. In principle, differential acoustic wave sensors may comprise two or more resonators exhibiting different resonance frequencies or a resonator working in multimode (several resonance frequencies), wherein differences in the measured frequencies reflect variations in the ambient parameters that is to be measured (the measurand) as, for example, temperature, pressure or strain.

However, despite the recent engineering progress, the entire interrogation process wherein an interrogator trans-mits an appropriate radiofrequency signal that is received by the acoustic wave sensor via a reception antenna and con-verted by a transducer into a surface acoustic wave (or bulk wave, in the case of devices of a bulk acoustic wave sensor type) that is converted into a radiofrequency signal being re-transmitted via an emission antenna and received and analyzed by the interrogator still poses demanding technical problems. Moreover, relatively bulky configurations known in the art have relatively high demands for space.

True differential measurements based on appropriate dif-ferential sensitivities of the resonances of the resonator(s) used to the measurand have to be accurately observed in order to obtain reliable measurement results. This poses severe demands for tolerances of the production processes and reproducibility of physical properties from one wafer to another. In addition, any relative motion between the sensor device and the interrogator can heavily affect the measure-ment results due to the RF link formed by the sensor device and the interrogator in an inductive, capacitive or radiative manner. Other environmental influences, for example, tem-perature changes, in the measurement environment also affect the reliability of the measurement results.

Therefore, it is an object of the present disclosure to provide an acoustic wave sensor that allows for an increased signal-to-noise ratio and more reliable measurement results and/or a more compact design as compared to the acoustic wave sensor devices of the art.

BRIEF SUMMARY

The present disclosure addresses the above-mentioned object by providing an acoustic wave sensor device, comprising a first interdigitated transducer, in particular comprising comb electrodes; a first reflection structure; a second reflection structure; a first resonance cavity comprising a first upper surface and formed between the first interdigitated transducer and the first reflection structure; a second resonance cavity comprising a second upper surface and formed between the first interdigitated transducer and the second reflection structure; and wherein at least one of the first and second upper surfaces is covered at least partly by a metalization layer or a passivation layer. In an alternative or in addition, at least one of the first and second upper surfaces may be physically and/or chemically modified by other means, for example, by recessing the respective surface.

The present disclosure addresses the above-mentioned object by providing an acoustic wave sensor device, comprising a first interdigitated transducer, a first reflection structure, a second reflection structure, a first resonance cavity comprising a first upper surface and formed between the first interdigitated transducer and the first reflection structure; and a second resonance cavity comprising a second upper surface and formed between the first interdigitated transducer and the second reflection structure and first and second resonance cavity differ from each other in that one of them exhibits some physical and/or chemical modifications as compared to the other one.

Either the first or the second upper surface may be covered at least partly by a metalization layer or a passivation layer. In an alternative, the first and second upper surfaces may be covered by different materials.

The first reflection structure may comprise or consist of a Bragg mirror (comprising elongated electrodes arranged in parallel to each other) and/or the second reflection structure may comprise or consist of a Bragg mirror (comprising other elongated electrodes arranged in parallel to each other). Alternatively, at least one of the first or second reflection structures may comprise a groove or an edge reflection structure or a short reflector comprising not more than three electrodes. Such reflection structures may be easily formed and may provide high reflectivity. One skilled in the art would know how to adjust the depth of the groove or the thickness of the electrode to provide a reflection coefficient in excess of 20%, which is achievable for a given crystal orientation, wave polarization and electrode nature.

The acoustic wave sensor device may comprise a substrate comprising a piezoelectric layer and a non-piezoelectric bulk substrate or it may comprise a (uniform) piezoelectric substrate. The non-piezoelectric bulk substrate may be a silicon substrate, and optionally comprise at its surface a so-called trap-rich layer (e.g., provided by a layer of polycrystalline silicon). The trap-rich layer allows reducing the insertion loss and RF loss due to electric charge trapping induced at the interface with the silicon substrate.

The metalization layer or passivation layer may be formed on or over the piezoelectric layer or piezoelectric substrate, respectively. The metalization layer may comprise or consist of at least one of AlCu and Ti and the passivation layer may comprise or consist, but is not limited to, of at least one of $Si_3N_4$, $Al_2O_3$, AlN, $Ta_2O_5$ and $SiO_2$. The metalization layer may be made of the same material as electrodes of the first transducer (and, thus, may be formed in the same processing step as the one used for forming the electrodes).

If Bragg mirrors are used as reflection structures, they may be made of the same metal material as used for the formation of the metalization layer and/or the electrodes of the first transducer.

The modification of one of the first and second upper surfaces of the resonance cavities by a metalization layer or passivation layer may result in that the propagation characteristics of acoustic waves generated by the interdigitated transducer differ in the second resonance cavity from the ones in the first resonance cavity. Thereby, a very reliable and sensitive differential sensor device may be provided.

Without modification, the first and second upper surfaces are free (exposed) surfaces, particularly, free surfaces of a piezoelectric layer (see description below). A material layer may be formed on the second upper surface only or a material layer on the second upper surface and another material layer (which is made of a different material as compared to the material layer formed on the second upper surface) on the first upper surface may be formed.

According to an embodiment, the first transducer is positioned on one side of the first resonance cavity and the second resonance cavity may be positioned on the other side of the first resonance cavity with the first reflection structure separating the first resonance cavity from the second resonance cavity. Thus, the second resonance cavity may be formed between the first reflection structure and the second reflection structure. In such a configuration the separation of the resonance cavities is not provided by the transducer but rather an intermediate reflection structure (namely, the first reflection structure). A compact design may be achieved by such a configuration.

In such a configuration, a third reflection structure may be provided and the interdigitated transducer may be arranged between the third reflection structure and the first resonance cavity. The third reflection structure may improve the reflectivity provided by the first transducer (operating both as a source of surface acoustic waves and as a reflector). The third reflection structure may comprise or consist of a Bragg mirror (comprising elongated electrodes arranged in parallel to each other). One skilled in the art knows how to adjust the first reflection structure in order to allow energy to be transferred to the second resonance cavity.

According to an embodiment, the acoustic wave sensor device further comprises a second interdigitated transducer and a fourth reflection structure disposed between the first and second interdigitated transducers. The first interdigitated transducer comprises a first number of electrodes and the second interdigitated transducer comprises a second number of electrodes and the first number of electrodes may be different from the second number. Additionally or alternatively, the lengths of at least some of the electrodes of the first number of electrodes may be different from the lengths of at least some of the electrodes of the second number of electrodes (i.e., the lengths of the two transducers in a direction perpendicular to the traveling direction of the surface acoustic waves). Further, the apertures of the first and second transducers may differ from each other. By such approaches, a fine tuning is made available in order to compensate for intrinsic losses caused by the metalization or passivation layer due to diffusion, wave velocity changes, change of optimal resonance conditions, etc.

In the above-described embodiments the first and second transducers may be considered as split parts (operating in parallel) of a single transducer. Such a configuration is advantageous in operation situations in that the reflection coefficient of the first transducer is not strong enough to allow for a clear enough separation between the individual resonance cavities.

Moreover, cascaded resonance cavities may be formed in the acoustic wave sensor device according to one of the above-described embodiments in order to reduce the number of resonances to arrive at unique measurement results. Thus, the acoustic wave sensor device according to one of the above-described examples may be configured such that the first resonance cavity comprises first sub-cavities separated from each other by first reflection sub-structures of the first reflection structure and the second resonance cavity comprises second resonance sub-cavities separated from each other by second reflection sub-structures of the second reflection structure. Each of the reflection sub-structures may consist of elongated electrodes arranged in parallel to each other.

According to an embodiment, the acoustic wave sensor device further comprises a quartz material layer comprising a planar surface and the first interdigitated transducer and the first and second reflection structures are formed on or over the quartz material layer and the first and second resonance cavities comprise parts of the quartz material layer and the planar surface of the quartz material layer is defined by a crystal cut of a quartz material of the quartz material layer with angles $\varphi$ in the range of $-14°$ to $-24°$, $\theta$ in the range of $-25°$ to $-45°$ and $\Psi$ in the range of $+8°$ to $+28°$, in particular, $\varphi$ in the range of $-17°$ to $-22°$, $\theta$ in the range of $-30°$ to $-40°$ and $\Psi$ in the range of $+10°$ to $+25°$, and more particularly, $\varphi$ in the range of $-19°$ to $-21°$, $\theta$ in the range of $-33°$ to $-39°$ and $\Psi$ in the range of $+15°$ to $+25°$. Particularly, the angles for the crystal cut may be $\varphi=-20°$, $\theta=-36°$ and $\Psi=15°$ to $25°$, in particular, $17°$.

Note that the above definition is equivalent to angles $\varphi$ in the range of $+14°$ to $+24°$, $\theta$ in the range of $-25°$ to $-45°$ and $\Psi$ in the range of $-8°$ to $-28°$, according to symmetry conditions for crystal cuts rotated around the Z axis (i.e., non zero $\varphi$ and $\Psi$ angles for a given crystal cut). More explicitly, one can state according symmetry rules that a (YXwlt)/$+\varphi/+\theta/+\Psi$ cut is equivalent to a (YXwlt)/$-\varphi/+\theta/-\Psi$ cut.

The angles defining the crystal cut and, thus, the planar surface, are defined in accordance with the IEEE 176 1949 Standards on Piezoelectric Crystals, 1949 from Dec. 12, 1949. The quartz crystal may have a cutting plane (X", Z") defined with respect to the cutting plane (X, Z) and in a reference system (X", Y", Z"), where X, Y, Z are crystallographic axes of quartz, a direction of propagation of the waves being defined along an axis X''', a first cutting plane (X', Z') being defined by rotation by an angle $\varphi$ about the axis Z of the plane (X, Z) so as to define a first reference system (X', Y', Z') with an axis Z' that is the same as the axis Z, a second cutting plane (X", Z") being defined by rotation by an angle $\theta$ about the axis X' of the plane (X', Z') so as to define a second reference system (X", Y", Z") with the axis X" being the same as the axis X', the direction of propagation along the axis X''' being defined by rotation by an angle $\Psi$ of the axis X", in the plane (X", Z") about the axis Y", wherein according to the present disclosure: $\varphi$ is in the range of $-14°$ to $-24°$, $\theta$ in the range of $-25°$ to $-45°$ and $\Psi$ in the range of $+8°$ to $+28°$.

Experiments have shown that a quartz material layer for an acoustic wave sensor device resulting from such kind of crystal cut can provide low sensitivities to mechanical stresses and robustness of the measurement against environmental influences. A linear sensitivity of differential frequency sensitivities (linearity of temperature-frequency dependence) can be achieved. In fact, the obtainable resonance frequency sensitivity allows for a measurement sensitivity of more than 1 ppm per Kelvin in the context of temperature measurements by means of the provided acoustic wave sensor device. Variations of the second order temperature coefficient of differential frequency of 2 or even 1 ppb $K^{-2}$ can be achieved.

The quartz material layer can be a quartz bulk substrate or a quartz layer formed on a non-piezoelectric bulk substrate. In the latter case, the non-piezoelectric bulk substrate may be a silicon substrate, and optionally comprises at its surface a so-called trap-rich layer (e.g., provided by a layer of polycrystalline silicon). The trap-rich layer allows reducing the insertion loss and reducing RF loss due to electric charge trapping induced at the interface with the silicon substrate. It can be also a sapphire substrate that is of high interest to maximize the quality factor of the resonance by minimizing the visco-elastic losses in the substrate. Sapphire is known to be one of the most advantageous materials according to that aspect (with Ytrium based garnets and more particularly Ytrium Aluminum Garnet—YAG).

The acoustic wave sensor device according to one of the above-described examples may be a POI device and, thus, may comprise a bulk substrate, in particular, an Si bulk substrate or a quartz substrate, a dielectric layer, in particular, an $SiO_2$ layer, formed on the bulk substrate, Further, the acoustic wave sensor device may comprise a piezoelectric layer, in particular, an $LiNbO_3$ or $LiTaO_3$ layer, formed on or over the bulk substrate. In this case, the first interdigitated transducer and the first and second reflection structures are formed on or over the upper surface of the piezoelectric layer and the first and second resonance cavities comprise (parts of) the piezoelectric layer.

In all of the above-described embodiments the extension lengths (in the direction of propagation of the acoustic waves) of the first resonance cavity and the second resonance cavity may differ from each other in order to more clearly separate the spectral responses of the resonances of the first resonance cavity and the second resonance cavity from each other.

In general, the acoustic wave sensor device according to one of the above-described examples may be a passive surface acoustic wave sensor device configured for sensing an ambient parameter, for example, one of a temperature, chemical species, strain, pressure or torque of a rotating axis.

In an embodiment, the first interdigitated transducer, the first reflection structure, the second reflection structure, the first resonance cavity and the second resonance cavity may be arranged along one line. In the case that one of the first and second upper surfaces of the resonance cavities is modified, in particular by a metalization layer or passivation layer, so that the propagation characteristics of acoustic waves generated by the interdigitated transducer differ in the second resonance cavity from the ones in the first resonance cavity, a sensor device, in particular a differential sensor device, with a single-line architecture can be provided, which corresponds to a compacter design compared to sensor designs using two lines.

Moreover, it is provided an acoustic wave sensor assembly comprising one or more acoustic wave sensor devices according to one of the above-described examples. In particular, the acoustic wave sensor assembly may comprise the acoustic wave sensor device according to one of the above-described examples, and may further comprise another acoustic wave sensor device connected in series or in parallel to the acoustic wave sensor device according to one of the above-described examples, the other acoustic wave sensor device comprising a third interdigitated transducer; a fifth reflection structure and a sixth reflection structure; a third resonance cavity comprising a third upper surface and formed between the third interdigitated transducer and the fifth reflection structure; and a fourth resonance cavity comprising a fourth upper surface and formed between the third interdigitated transducer and the fifth reflection structure.

In such an acoustic wave sensor assembly the first and second upper surfaces may be both covered at least partly by a metalization layer or a passivation layer, for example, a metalization layer or a passivation layer made of or comprising the same material over the first upper surface of the first resonance cavity and the second upper surface of the second resonance cavity, and the third and fourth upper surfaces of the resonance cavities of the other acoustic wave sensor device may not be covered, or covered by a different metalization layer or a different passivation layer with respect to the first and second upper surfaces.

By the acoustic wave sensor assembly comprising two surface acoustic wave sensor devices connected in series (for measurements based on anti-resonance, cf. US 2017/033840 A1) or in parallel (for measurements based on resonance) differential sensitivity of the measurements may be increased as compared to the employment of one single acoustic wave sensor device. Resonances provided by the first and second resonance cavities may not be equivalent to each other due to the formation of one or more metalization or passivation layer. Particularly, the quality factor provided by metallized resonance cavities may be reduced as compared to resonance cavities with free surfaces. When providing two acoustic wave sensor devices connected to each other, each of the two acoustic wave sensor devices can be adapted separately from the other (for example, with respect to the lengths and number of electrodes of the respective transducers of the two surface acoustic wave sensor devices) in order to improve the dynamics of the responses and meet any desired operating point given by an actual Statement of Work.

Furthermore, it is provided a system for monitoring/measuring an ambient parameter, for example, a temperature, a strain level, a pressure or a torque level of a rotating axis, a chemical species, etc., that comprises an interrogation device and an acoustic wave sensor device and/or acoustic wave sensor assembly according to one of the above-described embodiments that is communicatively coupled to the interrogation device.

The interrogation device for interrogating an acoustic wave sensor may comprise a transmission antenna configured for transmitting a radiofrequency interrogation signal to the acoustic wave sensor device, a reception antenna configured for receiving a radiofrequency response signal from the acoustic wave sensor device that may also comprise a transmission/reception antenna and a processing means for processing/analyzing the radiofrequency response signal in order to determine an ambient parameter that is to be sensed.

BRIEF DESCRIPTION OF THE DRAWINGS

Additional features and advantages of the present disclosure will be described with reference to the drawings. In the description, reference is made to the accompanying figures that are meant to illustrate preferred embodiments of the present disclosure. It is understood that such embodiments do not represent the full scope of the present disclosure.

DETAILED DESCRIPTION

Figure 1:
FIG. 1 represents an example of a surface acoustic wave sensor device according to the art.
Figure 1:
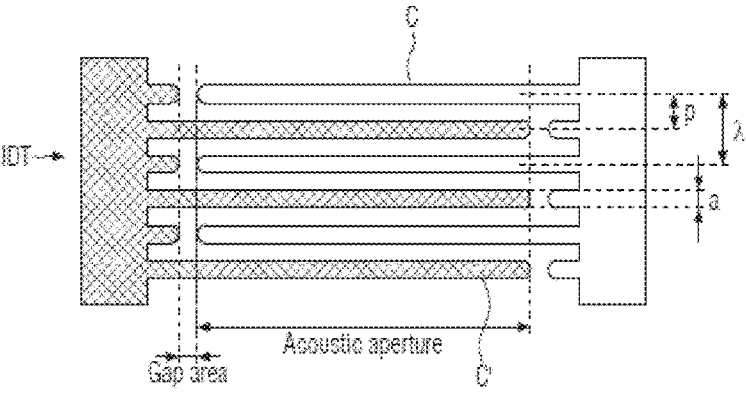
Figure 1:
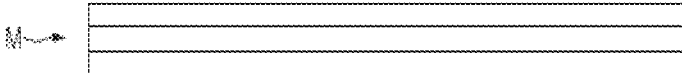

The present disclosure provides acoustic wave sensors, in particular, passive SAW sensors, that are characterized by a high signal-to-noise ratio, sensitivity and reliability. With respect to temperature measurements, for example, the obtainable resonance frequency sensitivity allows for a measurement sensitivity of more than 1 ppm per Kelvin. The acoustic wave sensors can be interrogated by any interrogators that are configured to determine a response spectrum from an interrogated acoustic wave sensor. The interrogated acoustic wave sensor can, for example, be a resonator device, for example, a differential SAW sensor. It goes without saying that the present disclosure can be implemented in any devices employing acoustic wave sensors or dielectric resonators, RLC circuits, etc.

The interrogation device (also called unit) interrogating one of the inventive acoustic wave sensor devices may comprise a transmission antenna for transmitting a radiofrequency interrogation signal to the sensor device and a reception antenna for receiving a radiofrequency response signal from the sensor device. The radiofrequency interrogation signal transmitted by the transmission antenna may be generated by a signal generator that may comprise a radiofrequency synthesizer or controlled oscillator as well as optionally some signal shaping module providing a suitable frequency transposition and/or amplification of the signal to be transmitted by the transmission antenna. The radiofrequency interrogation signal generated by the signal generator may be a pulsed or bursty signal with a frequency selected according to the resonance frequency of the acoustic wave sensor device. It is noted that the emission antenna and the reception antenna may be the same antenna. In this case, the emission and reception process should be synchronized with each other, for example, by means of a suitably controlled switch.

Furthermore, the interrogation device may comprise a processing means connected to the reception antenna. The processing means may comprise filtering and/or amplification means and be configured for analyzing the radiofrequency response signal received by the reception antenna. For example, the sensor device operates at a resonance frequency of 434 MHz or 866 MHz or 915 MHz or 2.45 GHz (the ISM bands).

The interrogation device may transmit a long radiofrequency pulse and after the transmission has been stopped, the resonance cavities of the sensor device discharge at their resonant eigenfrequencies with time constants $\tau$ equal to $Q/\pi F$ wherein F is the central frequency and $Q_f$ is the quality factor of the resonance, $Q_f$ corresponding to the ratio between the resonance central frequency and the width at half maximum of the band pass used in the interrogation process. For instance, $Q_f$ corresponds to the resonance quality factor estimated on the real part of the resonator admittance (the conductance) when the latter is designed to operate at the resonance. Spectral analysis performed by the processing means of the interrogation device allows for calculating the resonator frequency/frequencies and, thereby, the sensing of an ambient parameter. The received radiofrequency response signal may be mixed by the processing means with radiofrequency interrogation signal according to the so-called I-Q protocol as known in the art to extract the real and imaginary parts (in-phase components $I=Y \cos \varphi$ and quadrature components $Q=Y \sin \varphi$ with the signal amplitude Y and the signal phase (p) from which the modulus and phase can then be derived.

Figure 2A:
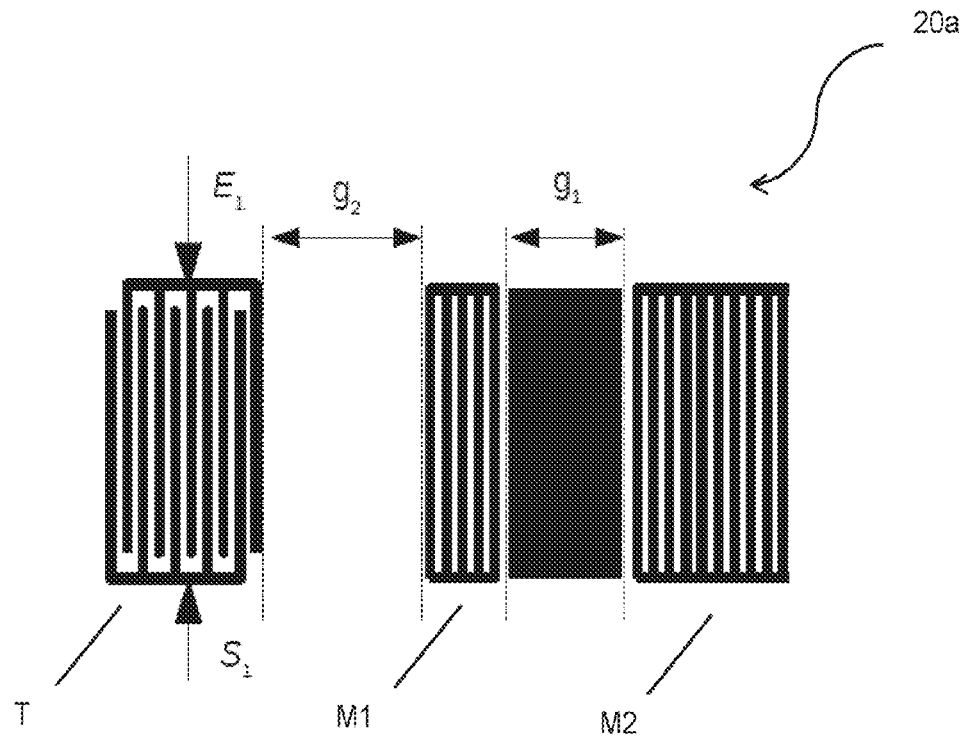
FIG. 2A represents an example of a surface acoustic wave sensor device wherein resonance cavities are arranged on one side of a transducer only according to an embodiment of the present disclosure.

FIG. 2A illustrates an exemplary embodiment of an inventive surface acoustic wave (SAW) sensor device 20a. A SAW sensor device according to an embodiment of the present disclosure, for example, the SAW sensor device 20a shown in FIG. 2A, comprises a transducer T. The transducer T is built in the form of an interdigitated (a comb) transducer (IDT) connected to an antenna (not shown in FIG. 2A) for receiving an electromagnetic wave E1 (a radiofrequency interrogation signal) and converting the electromagnetic wave E1 into a surface acoustic wave.

The surface acoustic wave sensor device 20a comprises a first Bragg mirror structure M1 and a second Bragg mirror structure M2. A first resonance cavity of the length g1 is defined between the first Bragg mirror structure M1 and the second Bragg mirror structure M2 and a second resonance cavity of the length g2 is defined between the transducer T and the first Bragg mirror structure M1. Thus, the transducer T converts a radiofrequency interrogation signal E1 received by the antenna into a surface acoustic wave that is reflected back by the Bragg mirrors M1 and M2 of the resonance cavities of the lengths g1 and g2, respectively, and converted back into a radiofrequency signal S1 by the transducer. The back-converted acoustic wave is in course transmitted by the antenna (or another antenna) as a radiofrequency response signal. The surface acoustic wave sensor device 20a (as well as the devices described below with reference to other ones of the figures) may operate at Bragg conditions with wavelengths of the excited surface acoustic waves of some multiples of the pitches of the comb electrodes of the comb transducer T. When operation is performed at Bragg conditions the comb transducer T itself substantially functions as a mirror. It is noted that the efficiency of this functioning as a mirror depends on the wave polarization, the nature and shape of the obstacle and the substrate properties. It is noted that one skilled in the art knows how to adapt the first Bragg mirror structure M1 in order to allow energy to be exchanged between the first and second resonance cavities, e.g., by reducing the number of electrode fingers.

The mirror gratings of the first Bragg mirror structure M1 and of the second Bragg mirror structure M2 may differ from each other (as shown in FIG. 2A) and may be suitably adapted to result in optimum resonance conditions. The lengths g1 and g2 of the resonance cavities (along the traveling direction of the surface acoustic waves) may be different from each other wherein changing the length of one of the resonance cavities translates to locally modifying the wave propagation properties. More than two resonance cavities may be provided according to different embodiments. Note, that a compact design can be realized by a SAW sensor device according to the embodiment illustrated in FIG. 2A. Moreover, satisfying response dynamics can be achieved by the shown configuration.

The sensor device 20a may comprise a SAW-based sensor built on single-crystal piezoelectric materials like quartz ($SiO_2$), lithium niobate ($LiNbO_3$), lithium tantalate ($LiTaO_3$), langasite (LGS) or poly-crystal piezoelectric materials like aluminum nitride (AlN) or zinc oxide (ZnO), in particular, deposited on silicon, or even on a Piezo-On-Insulator (POI) composite material comprising a layer of piezoelectric material, in particular, a single-crystal material, such as, for example, lithium tantalate or lithium niobate, bonded to a support substrate as, for instance, silicon, if necessary by means of a bonding layer, as, for instance, a silicon oxide layer. As already mentioned, a so-called trap-rich layer (e.g., polycrystalline silicon) can be present at the interface with the silicon support substrate.

In the embodiment shown in FIG. 2A, the provided resonance cavities of the lengths g1 and g2, respectively, differ from each other in that one of them, the one with length g1, exhibits some physical and/or chemical modifications, indicated in black, as compared to the other one. By the physical and/or chemical modifications different propagation conditions and, thus, different resonance characteristics, are provided in the different resonance cavities. Multiple resonances according to multiple resonance cavities and, thus, differential effects when comparing resonances characterizing each of the multiple resonance cavities thereby arise.

There is a variety of means for providing the physical and/or chemical modifications in order to achieve propagating wave modes that exhibit differential parametric sensitivities. These means, for example, include realization of the physical and/or chemical modifications by the formation of a metalization layer and/or passivation layer. A metalization layer of some 100 nm thickness may be formed on the region of the resonance cavity of length g1, for example; no metalization layer may be formed on the resonance cavity of length g2. The metalization layer may be formed of the same material as the electrodes of the transducer T and/or the Bragg mirror structure M1 and/or the Bragg mirror structure M2.

When the same material is used for the metalization and the formation of the comb transducer T and electrodes of the Bragg mirror structures M1 and M2, all of these elements can be deposited in the same deposition process.

In other embodiments, a different material is used for the metalization. For example, one metalization layer or passivation layer of one material is formed on the first resonance cavity of length g1 and another metalization layer or passivation layer of another material is formed on the second resonance cavity of length g2. According to another example, a positive-temperature shifting material, for example, $SiO_2$ or $Ta_2O_5$, is formed on one of the resonance cavities and a negative-temperature shifting material, for example, $Si_3N_4$ or AlN, or no additional material is formed on the other one of the resonance cavities.

Passivation may be realized by forming a passivation layer made of or comprising $Si_3N_4$, $Al_2O_3$ or AlN. According to other embodiments, material layers can be formed on both resonance cavities. Moreover, material layers formed on one or more of the resonance cavities may have inhomogeneous thicknesses along the direction of propagation of the acoustic waves. Further, multi-layers may be formed on one or more of the resonance cavities. In this context, it should be noted that, in general, provision of a material layer on a resonance cavity may result in a reduction of the phase velocity of acoustic waves due to mass loading effects, particularly, if layers of a material of a high atomic number, as Pt, Au or W, are used. This effect can be compensated by adding a layer exhibiting a relatively high acoustic velocity, for example, AlN, $Si_3N_4$, $Al_2O_3$, adjacent to the piezoelectric material layer. The resonance cavities exhibit different sensitivities to measurands due to the provided different resonance characteristics caused by different treatments of the surfaces and, thus, allow for differential measurements.

By using cavities with different modifications, a differential sensor device 20a comprising the transducer structure, the first and second reflection structure and the first and second cavity can be formed on a same and only one line. Such a device then has a single-line architecture, which is more compact than double line or dual-lines architectures.

Figure 2B:
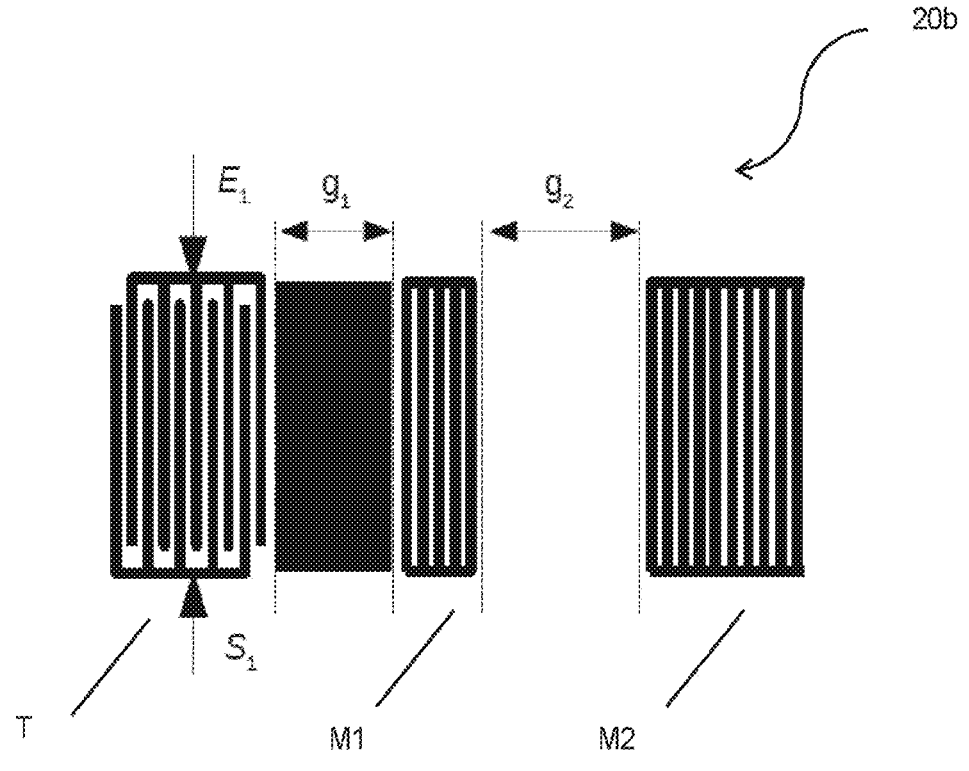
FIG. 2B represents an example of a surface acoustic wave sensor device wherein resonance cavities are arranged on one side of a transducer only according to another embodiment of the present disclosure.

According to another embodiment, the first resonance cavity of a surface acoustic wave sensor device 20b comprising physical and/or chemical modifications, for example, in form of a metal layer, is closer to the transducer than the other second resonance cavity that may comprise no physical and/or chemical modifications, see FIG. 2B. Again all elements of the sensor device 20b are arranged on a single line.

Figure 2C:
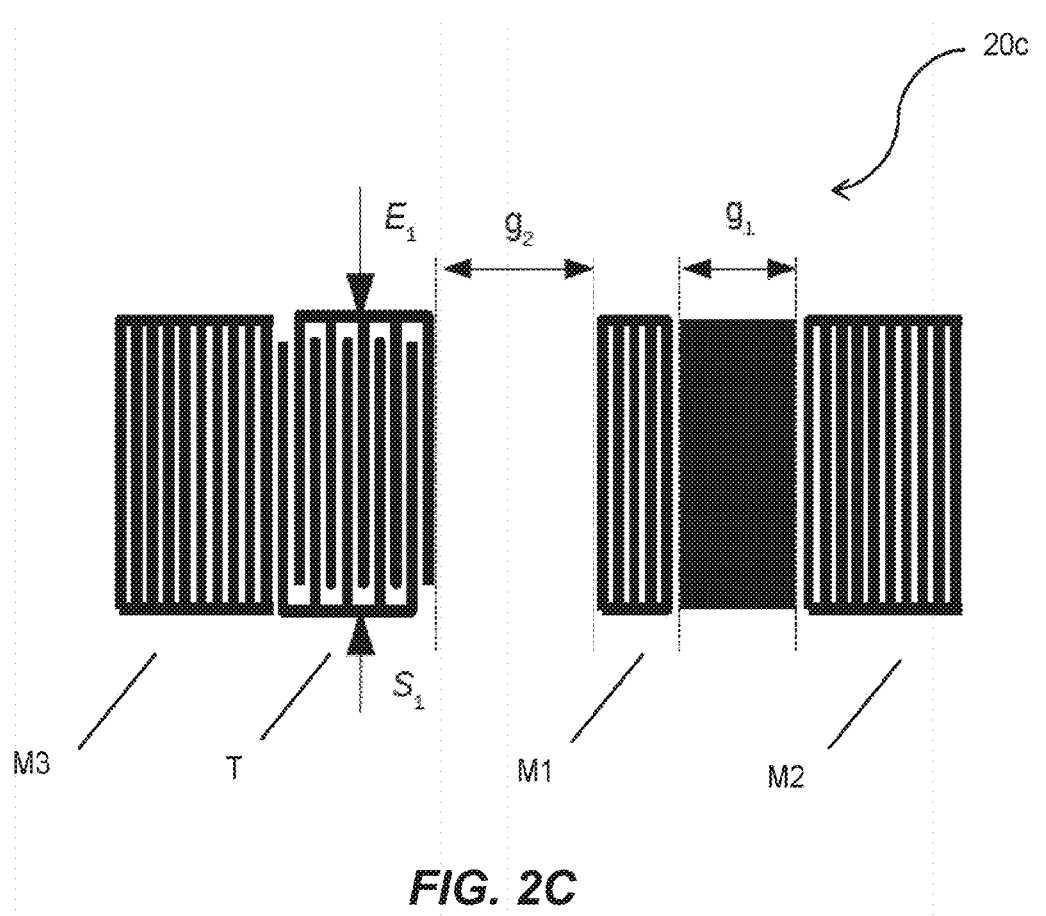
FIG. 2C represents an example of a surface acoustic wave sensor device wherein resonance cavities are arranged on one side of a transducer only according to yet another embodiment of the present disclosure.

In both sensor devices 20a and 20b shown in FIGS. 2A and 2B, respectively, the reflectivity of the transducer T may be enhanced by an additional reflection structure, for example, a third Bragg mirror structure M3 as it is shown in FIG. 2C. In this case, the transducer T is positioned between the additional Bragg mirror structure M3 and a resonance cavity. As described above with respect to the sensor device 20a, all elements of the sensor device 20c, thus the transducer T and the mirrors M1 to M3 are all arranged on the same line and can form a sensor device with a single line architecture.

In all of the above-described embodiments, Bragg mirrors are provided in order to form the resonance cavities. However, according to alternative embodiments one or more of the Bragg mirrors may be replaced by side/edge reflection structures for pure shear mode guidance. Thereby, very compact configurations can be achieved in that the Bragg reflection is replaced by a flat surface reflection without any energy loss or mode conversion. Configurations with side/edge reflection structures for pure shear mode guidance are particularly useful for sensing ambient parameters in liquids. Shear waves are very suitable for in-liquid probing. Particularly, highly coupled modes (>5%) together with high-k materials (with a dielectric constant k larger than 30, for example) are attractive for in-liquid applications. According to other embodiments, one or more reflection structures are realized in the form of short reflectors comprising not more than three electrodes.

In all of the above-described embodiments comprising Bragg mirrors, simple resonance cavities are employed. However, all of these embodiments may employ cascaded resonance cavities comprising multiple mirror electrode structures. The spectral distance between the two resonances as well as the coupling coefficient of the resonances can be controlled by the number of the mirror electrode structures and resonance sub-cavities.

In the case of using cascaded resonator cavities, it is possible to use a transducer, which does not operate at the Bragg condition. For instance, the transducer may exhibit three or four fingers per wavelength or even five fingers per two wavelength and in general all suitable structures allowing to excite waves at a given synchronism without wave reflection on the IDT electrodes.

Furthermore, it is noted that it is also envisaged herein an operation situation in that the reflection coefficient of the transducer is not strong enough to allow for a clear enough separation between the resonances of the cavities. In that case, (for example, in all of the above-described embodiments) the transducer T may be split into two parts (i.e., two transducers operating in parallel are provided) with an additional reflector provided in the middle of two parts in order to improve the cavity resonance separation. This will be particularly useful for Rayleigh or more generally elliptically polarized waves on quartz, langasite, lithium tantalate single-crystal substrates and composite substrates including GaN, AlN and ZnO layers because the corresponding modes are generally exhibiting a coupling factor smaller than 1% and a reflection coefficient on a unique electrode of less than 5%, typically less than 3% and even less than or equal to 1%. In some extent, the reflection coefficient is related to the coupling factor as it is generally composed of a mechanical part (elastic and mass loading effect) and an electric part (electrical load effect). The IDT may be split into two parts in any of the configurations of SAW sensor devices provided herein, particularly, the configurations shown in FIGS. 2A-2C. The two parts (or two transducers) may be different from each other with respect to the length (perpendicular to the traveling direction of the surface acoustic waves), number of electrodes, apertures, etc., in order to achieve optimum resonance conditions.

For POI configurations using $LiTaO_3$ layers with an electromechanical coupling in excess of 5%, it can be demonstrated by computation that the reflection coefficient is larger than 5% and may reach 10% or even more (15% measured, >20% computed considering metal of high atomic number). For quartz, it can be shown that adding a central mirror inside the transducer allows for obtaining the separation of the two cavity modes. This consideration is particularly true for AlCu based electrodes. The use of electrode with high atomic number like, for instance, molybdenum or gold or platinum or tungsten may allow for large reflection coefficients (particularly for single crystals, not for AlN or GaN based layered substrates). It is also of interest in such a configuration to use single-phase unidirectional transducers (SPUDT) in order to promote the emission of the waves in a given direction, again, in order to facilitate the separation between the resonances of the cavities.

In general, the acoustic wave sensor device according to one of the above-described examples may be a passive surface acoustic wave sensor device configured for sensing an ambient parameter, for example, one of a temperature, chemical species, strain, pressure or torque of a rotating axis.

The acoustic wave sensor device according to one of the above-described examples may be part of an acoustic wave sensor assembly that is also provided herein. Exemplary embodiments of such an acoustic wave sensor assembly are shown in FIGS. 3A and 3B.

Figure 3A:
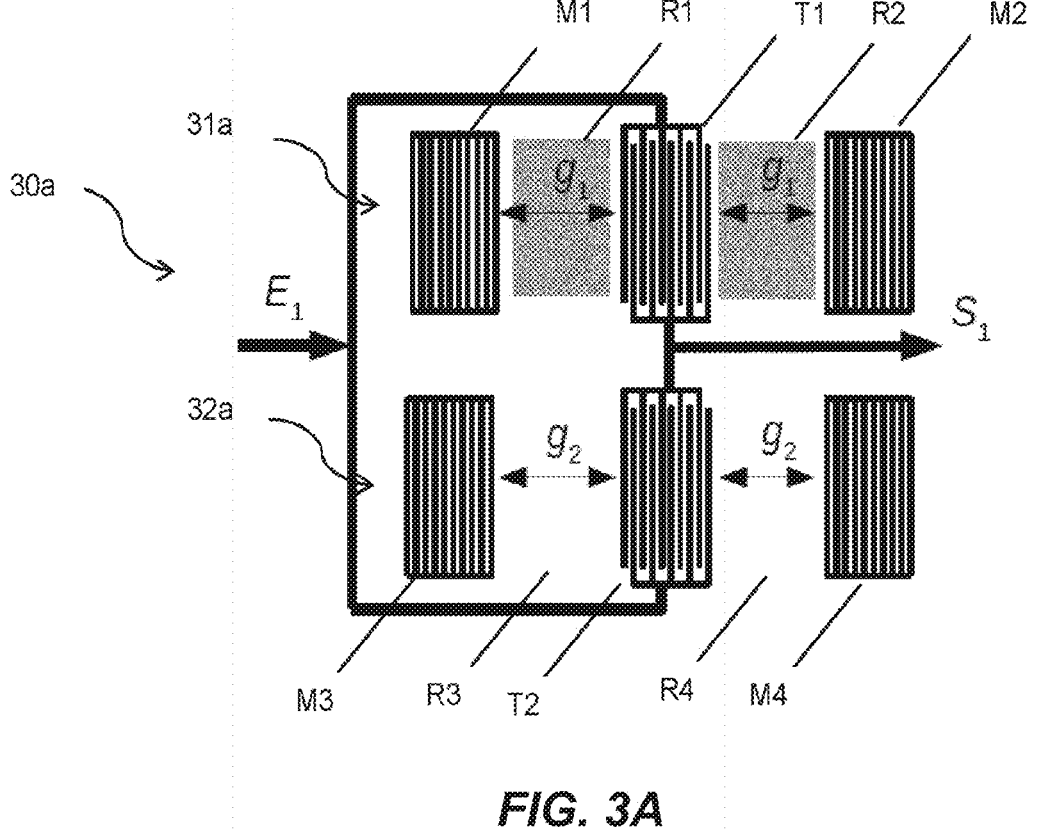
FIG. 3A represents an example of a surface acoustic wave sensor assembly according to an embodiment of the present disclosure.
Figure 3B:
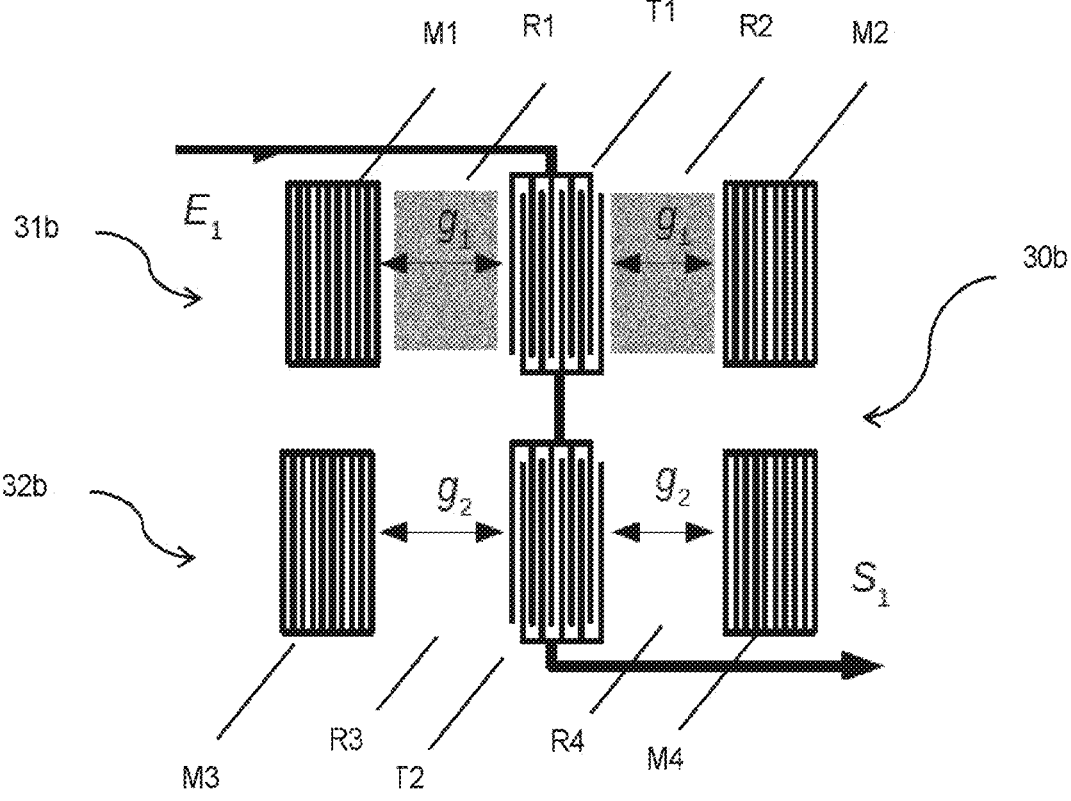
FIG. 3B represents an example of a surface acoustic wave sensor assembly according to another embodiment of the present disclosure.

An acoustic wave sensor assembly according to an embodiment of the present disclosure as, for example, the acoustic wave sensor assembly 30a shown in FIG. 3A, comprises a first SAW sensor device 31a and a second SAW sensor device 32a. The two types of resonators (SAW sensor devices 31a and 32a) can be advantageously optimized independently from each other, focusing on the idea to benefit from balanced resonator responses. For example, one can change the aperture of one resonator or the IDT length to improve the dynamics of the response and meet any operating point according the imposed Statement of Work. The first SAW sensor device 31a comprises a first IDT T1, a first Bragg mirror structure M1 and a second Bragg mirror structure M2. A first resonance cavity R1 is formed between the first Bragg mirror structure M1 and the first IDT T1 and a second resonance cavity R2 is formed between the second Bragg mirror structure M2 and the first IDT T1. The first resonance cavity R1 and the second resonance cavity R2 may have the same length g1 or they may have different lengths.

Moreover, the second SAW sensor device 32*a* comprises a second IDT T2, a third Bragg mirror structure M3 and a fourth Bragg mirror structure M4. A third resonance cavity R3 is formed between the third Bragg mirror structure M3 and the second IDT T2 and a fourth resonance cavity R4 is formed between the fourth Bragg mirror structure M4 and the second IDT T2. The third resonance cavity R3 and the fourth resonance cavity R4 may have the same length g2 or they may have different lengths. The lengths g1 and g2 may be the same or differ from each other. One or more of the Bragg mirror structures M1 to M4 may be replaced by a groove or an edge reflection structure or a short reflector comprising not more than three electrodes as it is described above. One skilled in the art would know how to adjust the depth of the groove or the thickness of the electrode to provide a reflection coefficient in excess of 20%, which is achievable for a given crystal orientation, wave polarization and electrode nature.

According to the embodiment shown in FIG. 3A the first and second resonance cavities R1 and R2 of the first SAW sensor device 31*a* of the acoustic wave sensor assembly 30*a* comprise physical and/or chemical modifications (indicated in grey in FIG. 3A), for example, one of the physical and/or chemical modifications described above, in particular a metalization or passivation layer. For example, the first and second resonance cavities R1 and R2 of the first SAW sensor device 31*a* are covered by metal layers of the same material. On the other hand, the surfaces of the third resonance cavity R3 and the fourth resonance cavity R4 of the second SAW sensor device 32*a* of the acoustic wave sensor assembly 30*a* are free surfaces in the example shown in FIG. 3A. The first SAW sensor device 31*a* and second SAW sensor device 32*a* are connected in parallel to each other (resonant operation), i.e., they convert in parallel (synchronously) the same electromagnetic wave E1 (radiofrequency interrogation signal) received by an antenna (not shown) into a surface acoustic wave, which is then retransferred into the output signal S1.

In principle, the first transducer T1 of the first SAW sensor device 31*a* and/or the second transducer T2 of the second SAW sensor device 32*a* may be split into two parts with an additional reflection structure (for example, a Bragg mirror structure) being positioned between the two parts as it is described above. Further, rather than providing the two resonance cavities symmetric about a length axis of the first transducer T1, the first transducer T1 may be positioned left or right of the two resonance cavities R1 and R2 and, in this case, its reflectivity may be enhanced by an additional reflection structure, for example, a Bragg mirror structure (cf. configurations illustrated in FIGS. 2A-2C). Similarly, the second transducer T2 may be positioned left or right of the two resonance cavities R3 and R4 and, in this case, its reflectivity may be enhanced by an additional reflection structure, for example, a Bragg mirror structure (cf. configurations illustrated in FIGS. 2A-2C).

All of the above-described embodiments of a surface acoustic wave sensor device may be implemented in the first SAW sensor device 31*a* and/or second SAW sensor device 32*a* of the acoustic wave sensor assembly 30*a*. Particularly, the acoustic wave sensor assembly 30*a* may comprise a SAW-based sensor built on single-crystal piezoelectric materials like quartz ($SiO_2$), lithium niobate ($LiNbO_3$), lithium tantalate ($LiTaO_3$), langasite (LGS) or poly-crystal piezoelectric materials like aluminum nitride (AlN) or zinc oxide (ZnO), in particular, deposited on silicon, or even on a Piezo-On-Insulator (POI) composite material comprising a layer of piezoelectric material, in particular, a single-crystal material, such as, for example, lithium tantalate or lithium niobate, bonded to a support substrate as, for instance, silicon, if necessary by means of a bonding layer, as, for instance, a silicon oxide layer. As already mentioned, a so-called trap-rich layer (e.g., polycrystalline silicon) can be present at the interface with the silicon support substrate.

Resonances associated with metalized and free surface cavities are not strictly equivalent to each other. Metalized surface cavities may yield a lower quality factor as compared to surface cavities with free surfaces and their dynamic responses might be slower. Unbalanced responses might be disadvantageous with respect to the overall sensor interrogation process. Such problems may be alleviated by providing two SAW sensor devices in an acoustic wave sensor assembly as described above wherein each of the SAW sensor devices can be individually adjusted with respect to optimum resonance conditions.

FIG. 3B shows an alternative embodiment wherein two SAW sensor devices 31*b* and 32*b* of an acoustic wave sensor assembly 30*b* are connected in series to each other (anti-resonance operation).

Thus, an acoustic wave sensor assembly according to another embodiment of the present disclosure as, for example, the acoustic wave sensor assembly 30*b* shown in FIG. 3B, comprises a first SAW sensor device 31*b* and a second SAW sensor device 32*b*. Again, the two types of resonators (SAW sensor devices 31*b* and 32*b*) can be advantageously optimized independently from each other. The first SAW sensor device 31*b* comprises a first IDT T1, a first Bragg mirror structure M1 and a second Bragg mirror structure M2. A first resonance cavity R1 is formed between the first Bragg mirror structure M1 and the first IDT T1 and a second resonance cavity R2 is formed between the second Bragg mirror structure M2 and the first IDT T1. The first resonance cavity R1 and the second resonance cavity R2 may have the same length g1 or they may have different lengths along the traveling direction of the surface acoustic waves.

Moreover, the second SAW sensor device 32*b* comprises a second IDT T2, a third Bragg mirror structure M3 and a fourth Bragg mirror structure M4. A third resonance cavity R3 is formed between the third Bragg mirror structure M3 and the second IDT T2 and a fourth resonance cavity R4 is formed between the fourth Bragg mirror structure M4 and the second IDT T2. The third resonance cavity R3 and the fourth resonance cavity R4 may have the same length g2 or they may have different lengths. The lengths g1 and g2 may be the same or differ from each other. One or more of the Bragg mirror structures M1 to M4 may be replaced by a groove or an edge reflection structure or a short reflector comprising not more than three electrodes as it is described above.

According to the embodiment shown in FIG. 3B the first and second resonance cavities R1 and R2 of the first SAW sensor device 31*b* of the acoustic wave sensor assembly 30*b* comprise physical and/or chemical modifications (indicated in grey in FIG. 3B), for example, one of the physical and/or chemical modifications described above, in particular a metalization or passivation layer. For example, the first and second resonance cavities R1 and R2 of the first SAW sensor device 31*b* are covered by metal layers of the same material. On the other hand, the surfaces of the third resonance cavity R3 and the fourth resonance cavity R4 of the second SAW sensor device 32*b* of the acoustic wave sensor assembly 30*b* are free surfaces.

In principle, the first transducer T1 of the first SAW sensor device 31b and/or the second transducer T2 of the second SAW sensor device 32b may be split into two parts with an additional reflection structure (for example, a Bragg mirror structure) being positioned between the two parts as it is described above. Further, rather than providing the two resonance cavities symmetric about a length axis of the first transducer T1, the first transducer T1 may be positioned left or right of the two resonance cavities R1 and R2 and, in this case, its reflectivity may be enhanced by an additional reflection structure, for example, a Bragg mirror structure (cf. configurations illustrated in FIGS. 2A-2C). Similarly, the second transducer T2 of the second SAW sensor device 32b may be positioned left or right of the two resonance cavities R3 and R4 and, in this case, its reflectivity may be enhanced by an additional reflection structure, for example, a Bragg mirror structure (cf. configurations illustrated in FIGS. 2A-2C).

All of the above-described embodiments of a surface acoustic wave sensor device may be implemented in the first SAW sensor device 31b and/or the second SAW sensor device 32b of the acoustic wave sensor assembly 30b. Particularly, the acoustic wave sensor assembly 30b may comprise a SAW-based sensor built on single-crystal piezo-electric materials like quartz ($SiO_2$), lithium niobate ($LiNbO_3$), lithium tantalate ($LiTaO_3$), langasite (LGS) or poly-crystal piezoelectric materials like aluminum nitride (AlN) or zinc oxide (ZnO), in particular, deposited on silicon, or even on a Piezo-On-Insulator (POI) composite material comprising a layer of piezoelectric material, in particular, a single-crystal material, such as, for example, lithium tantalate or lithium niobate, bonded to a support substrate as, for instance, silicon, if necessary by means of a bonding layer, as, for instance, a silicon oxide layer. As already mentioned, a so-called trap-rich layer (e.g., polycrystalline silicon) can be present at the interface with the silicon support substrate.

All previously discussed embodiments are not intended as limitations but serve as examples illustrating features and advantages of the present disclosure. It is to be understood that some or all of the above described features can also be combined in different ways.

In the present disclosure, crystal cuts are defined in accordance with the IEEE 176 1949 Standards on Piezo-electric Crystals, 1949 from Dec. 12, 1949. In that standard, a crystal cut for SAW applications is uniquely defined by three angles, namely $\varphi$ and $\theta$ defining the rotation of the crystal according a reference configuration of the crystal and $\Psi$ a propagation direction defined in the plane ($\varphi$, $\theta$) that indicates the direction toward which the waves are propagating and hence the position of the transducer capable to launch the waves. Y and X denote crystalline axes considered as references for the definition of the initial state of the crystal plate. The first one is the axis normal to the plate whereas the second axis lies along the length of the plate. The plate is assumed to be rectangular, characterized by its length l, its width $\Psi$ and its thickness t. The length l is lying along the crystalline axis X, the width $\Psi$ is along the Z axis and the thickness t along the Y axis considering the given (YX) axis system.

Assuming now that none of the angles is zero, the general case of a triple-rotation or triply-rotated cut is considered. In that situation, the quartz crystal has a cutting plane (X", Z") defined with respect to the cutting plane (X, Z) and in a reference system (X", Y", Z"), where X, Y, Z are crystallographic axes of quartz, a direction of propagation of the waves being defined along an axis X'", a first cutting plane (X', Z') being defined by rotation by an angle $\varphi$ about the axis Z of the plane (X, Z) so as to define a first reference system (X', Y', Z') with an axis Z' that is the same as the axis Z, a second cutting plane (X", Z") being defined by rotation by an angle $\theta$ about the axis X' of the plane (X', Z') so as to define a second reference system (X", Y", Z") with the axis X" being the same as the axis X', the direction of propagation along the axis X'" being defined by rotation by an angle $\Psi$ of the axis X", in the plane (X", Z") about the axis Y".

Some symmetry rules are recalled hereafter for quartz. Quartz is a trigonal crystal of class 32. Therefore, it is characterized by a ternary axis, i.e., the Z axis around which one can establish the relation:

$$(YX_w)/\varphi=(YX_w))/(\varphi+120°$$

The two other axes are binary and therefore the following symmetry relations hold:

$$(YXl)/\theta=(YXl)/\theta+180°,(YXt)/-\Psi=(YXt)/\Psi+180°$$

For simple geometrical reasons, it is easy to demonstrate that the following set of axes are equivalent:

$$(YXwlt)/+\varphi/+\theta/+\Psi=(YXwlt)/-\varphi/+0/-\Psi$$

Actually, assuming that the upper face is identified by the plus sign for $\varphi$ (the face where the surface wave is assumed to propagate), the bottom face of the plate is obtained by changing the sign to minus. Considering that the symmetry operation does not change the sign of $\Psi$ would assume that the direction of Z'" on the bottom side is unchanged but actually it is rotated by 180°. Therefore, to recover the top surface situation, it is mandatory to apply a 180° rotation on $\Psi$, which actually is equivalent to a sign change. Note that for crystal cuts without rotation around Z)($\varphi$=$\theta$°, the following symmetry is effective:

$$(YXlt)/+\theta/+\Psi=(YXlt)/+\theta/-\Psi.$$

The invention claimed is:

1. An acoustic wave sensor device, comprising:

a first interdigitated transducer;

a first reflection structure;

a second reflection structure;

a first resonance cavity comprising a first upper surface and formed between the first interdigitated transducer and the first reflection structure; and a second resonance cavity comprising a second upper surface and formed between the first interdigitated transducer and the second reflection structure, wherein the second resonance cavity is formed between the first reflection structure and the second reflection structure and the first reflection structure separates the first resonance cavity from the second resonance cavity;

and wherein at least one of the first and second upper surfaces is covered at least partly by a metalization layer or a passivation layer.

2. An acoustic wave sensor device, comprising:

a first interdigitated transducer;

a first reflection structure;

a second reflection structure;

a first resonance cavity comprising a first upper surface and formed between the first interdigitated transducer and the first reflection structure;

a second resonance cavity comprising a second upper surface and formed between the first interdigitated transducer and the second reflection structure, wherein the second resonance cavity is formed between the first reflection structure and the second reflection structure and the first reflection structure separates the first resonance cavity from the second resonance cavity; and wherein the first and second resonance cavity differ from each other in that one of them exhibits some physical and/or chemical modifications as compared to the other one.

3. The acoustic wave sensor device of claim 2, wherein either the first or the second upper surface is covered at least partly by a metalization layer or a passivation layer.

4. The acoustic wave sensor device of claim 2, wherein the first and second upper surfaces are covered by different materials.

5. The acoustic wave sensor device of claim 2, wherein the first resonance cavity and the second resonance cavity are formed on the same side of the first interdigitated transducer.

6. The acoustic wave sensor device of claim 2, wherein at least one of the first or second reflection structures comprises a groove or an edge reflection structure or a short reflector comprising not more than three electrodes.

7. The acoustic wave sensor device of claim 2, wherein at least one of the first or second reflection structures comprises or consists of a Bragg mirror.

8. The acoustic wave sensor device of claim 2, further comprising a third reflection structure and wherein the interdigitated transducer is arranged between the third reflection structure and the first resonance cavity.

9. The acoustic wave sensor device of claim 3, wherein the metalization layer comprises or consists of at least one of AlCu and Ti.

10. The acoustic wave sensor device of claim 3, wherein the passivation layer comprises or consists of at least one of $Si_3N_4$, $Al_2O_3$, AlN, $Ta_2O_5$ and $SiO_2$.

11. The acoustic wave sensor device of claim 2, further comprising a second interdigitated transducer and a fourth reflection structure disposed between the first and second interdigitated transducers.

12. The acoustic wave sensor device of claim 11, wherein the first interdigitated transducer comprises a first number of electrodes and the second interdigitated transducer comprises a second number of electrodes and the first number of electrodes is different from the second number.

13. The acoustic wave sensor device of claim 11, wherein the first interdigitated transducer comprises a first number of electrodes and the second interdigitated transducer comprises a second number of electrodes and the lengths of at least some of the electrodes of the first number of electrodes are different from the lengths of at least some of the electrodes of the second number of electrodes.

14. The acoustic wave sensor device of claim 11, wherein an acoustic aperture of the first interdigitated transducer differs from an acoustic aperture of the second interdigitated transducer.

15. The acoustic wave sensor device of claim 2, wherein the first resonance cavity comprises first resonance sub-cavities separated from each other by first reflection sub-structures of the first reflection structure and the second resonance cavity comprises second resonance sub-cavities separated from each other by second reflection sub-structures of the second reflection structure.

16. The acoustic wave sensor device of claim 2, wherein the first resonance cavity has a first extension length and the second resonance cavity has a second extension length, wherein the first extension length and the second extension length differ from each other.

17. The acoustic wave sensor device of claim 2, further comprising a quartz material layer comprising a planar surface; and wherein the first interdigitated transducer and the first and second reflection structures are formed on or over the quartz material layer and the first and second resonance cavities comprise parts of the quartz material layer; and wherein the planar surface of the quartz material layer is defined by a crystal cut of a quartz material of the quartz material layer with angles φ in the range of −14° to −24°, θ in the range of −25° to −45° and Ψ in the range of +8° to +28°, in particular, φ in the range of −17° to −22°, θ in the range of −30° to −40° and Ψ in the range of +10° to +25°.

18. The acoustic wave sensor device of claim 2, further comprising:

a bulk substrate;

a dielectric layer formed on the bulk substrate; and a piezoelectric layer;

and wherein the first interdigitated transducer and the first and second reflection structures are formed on or over the piezoelectric layer and the first and second resonance cavities comprise the piezoelectric layer.

19. The acoustic wave sensor device of claim 2, wherein the acoustic wave sensor device is a passive surface acoustic wave sensor device configured for sensing an ambient parameter selected from one of a temperature, chemical species, strain, pressure or torque of a rotating axis.

20. The acoustic wave sensor device of claim 2, wherein the first interdigitated transducer, the first reflection structure, the second reflection structure, the first resonance cavity and the second resonance cavity are arranged along one line.

21. An acoustic wave sensor assembly comprising the acoustic wave sensor device according to claim 2, and further comprising another acoustic wave sensor device connected in series or in parallel to the acoustic wave sensor device according to claim 2, the another acoustic wave sensor device comprising:

a third interdigitated transducer;

a fifth reflection structure and a sixth reflection structure;

a third resonance cavity comprising a third upper surface and formed between the third interdigitated transducer and the fifth reflection structure; and a fourth resonance cavity comprising a fourth upper surface and formed between the third interdigitated transducer and the fifth reflection structure.

22. The acoustic wave sensor assembly of claim 21, wherein the first and second upper surfaces are both covered at least partly by a metalization layer or a passivation layer, and wherein the third and fourth upper surfaces are not covered by a metalization layer or passivation layer.

* * * * *